United States Patent [19]
Chang et al.

[11] Patent Number: 5,891,808
[45] Date of Patent: Apr. 6, 1999

[54] METHOD FOR FABRICATING A DIE SEAL

[75] Inventors: Gene Jiing-Chiang Chang, Hsinchu Hsien; Chun-Cho Chen, Taipei, both of Taiwan

[73] Assignee: Winbond Electronics Corp., Hsinchu, Taiwan

[21] Appl. No.: 870,960

[22] Filed: Jun. 6, 1997

[30] Foreign Application Priority Data

Dec. 12, 1996 [TW] Taiwan ................................. 85115369

[51] Int. Cl.$^6$ .................................................. H01L 21/00
[52] U.S. Cl. .............................. 438/740; 216/2; 216/51; 216/67; 216/52; 438/462; 438/738
[58] Field of Search .................... 216/2, 51, 52, 216/67, 79, 99; 438/462, 464, 719, 723, 738, 740, 743, 756, 753; 156/345

[56] References Cited

U.S. PATENT DOCUMENTS 5,772,906 6/1998 Abraham .............................. 438/740 X Primary Examiner—William Powell
Attorney, Agent, or Firm—Ladas & Parry

[57] ABSTRACT

The present invention provides a method of fabricating a die seal. The die seal comprises a buffer area being adjacent to a die, a buffer space being adjacent to a scribe line, and a seal ring located between the buffer area and the buffer space. The seal ring is stacked by at least one metal layer and at least one dielectric layer. A passivation layer is formed and covers entire the die seal. The method comprises forming an amorphous silicon film on a top metal layer prior to the step of forming the passivation layer, and removing the dielectric layer on the buffer space by applying the amorphous silicon film as an etch stop layer in the step of etching the passivation layer to enhance the robustness of the die seal from damage by a lateral stress when a wafer is sawed. When the dielectric layer is made of $SiO_2$, a plasma containing $CF_4$ and $H_2$. can be utilized in the step of etching the passivation layer. Because the plasma has an extremely high etching selectivity ratio, the $SiO_2$ on the buffer space can be completely removed.

10 Claims, 4 Drawing Sheets

METHOD FOR FABRICATING A DIE SEAL

BACKGROUND OF THE INVENTION

1. Field of the Invention

The present invention relates to a semiconductor fabrication method, and, more particularly, to a method for fabricating a die seal structure around a chip die for preventing the internal circuit of the chip die from lateral stress induced during the period of cutting wafers.

2. Description of the Related Art

In the semiconductor process, a plurality of dies, each of which contains an integrated circuit, are fabricated on a semiconductor wafer at a time. Scribe lines are provided between every two adjacent dies so that the dies can be separated by cutting the semiconductor wafer along these scribe lines.

However, when a wafer is cut into a plurality of dies, lateral stress is induced, thereby affecting the internal circuits via the structure of the IC. Consequently, microcracking may occur which can affect the production yield. One approach for solving such a problem is to form a die seal structure between the scribe line and the peripheral region of the internal circuit. Therefore, stress induced by cutting wafers is generally blocked by the die seal and will not directly affect the internal circuit of a die. FIG. 1 shows a top view of a chip die. It should be noticed that all subsequent figures are not to scale. The die seal is directed to the structure between internal circuit 2 and scribe line 10. The die seal structure comprises buffer area 4, seal ring 6 and buffer space 8. Seal ring 6, which is a stacked structure comprising metal layers and dielectric layers, is usually formed together with buffer area 4 and buffer space 8 in the multi-metal interconnection process. The dielectric layer of the buffer space 8 is made of $SiO_2$.

FIG. 2 (PRIOR ART) and FIG. 3 (PRIOR ART) illustrate two cross-sectional views of the conventional die seal structures, respectively. It should be notified that the die seal structures shown in FIG. 2 and FIG. 3 are formed together with a triple-metal interconnection process. Now referring to FIG. 2, the whole structure is formed on silicon substrate 1. Field oxide 20 is used as an isolation structure and also can be used to separate a die seal structure (comprising buffer area 4, seal ring 6 and buffer space 8) and internal circuit 2. Seal ring 6 comprises three dielectric layers 610, 612 and 614, wherein dielectric layer 612 is formed over dielectric layer 610, and dielectric layer 614 is formed over dielectric layer 612. Each of dielectric layers 610, 612 and 614 is covered with metal layers 611, 613 and 615, respectively, which are formed together with the triple-metal process. Finally, passivation layer 616 is formed and covers all the dielectric layers and the metal layers. In summary, seal ring 6 of conventional die seal structure shown in FIG. 2 is produced by alternately depositing the dielectric layers and the metal layers. It should be noted that these dielectric layers and metal layers are formed during the common semiconductor process and do not require extra steps. In general, seal ring 6 has a width of about 20 $\mu$m, buffer area 4 between internal circuit 2 and seal ring 6 has a width of about 25 $\mu$m, and buffer space 8 between seal ring 6 and the scribe line has a width of about 5~10 $\mu$m.

The die seal structure shown in FIG. 3 is quite similar to that shown in FIG. 2, except in the following aspects. In FIG. 3, seal ring 6 includes three metal layers 621, 623 and 625, as in FIG. 2, and further includes metal plugs 631, 633 and 635, located between these metal layers. In this seal ring structure, metal layers 621, 623 and 625 and metal plugs 631, 633, 635 are also formed during the common metalization and plug process and do not require extra steps. Therefore, metal plugs 631, 633 and 635 are usually made of tungsten or aluminum. Such a seal ring structure is utilized in the die seal structure to enhance robustness to sawing stress, thereby preventing the internal circuit from damage.

In the development of process techniques, a technique called global planarization is commonly utilized. The most common one is CMP(chemical-mechanical polishing). When CMP is utilized in the fabrication process of semiconductors, the protection ability of the die seal may be reduced. The reason for this will be discussed in the following detailed description. When an inter-metal dielectric layer is planarized by using CMP, the dielectric layer between seal ring 6 and scribe line 10 may not be completely removed in the etching of the contact window and metal via and passivation, and may accumulate continually on the buffer space. Dielectric material 81 shown in FIG. 2 and dielectric layer 82 shown in FIG. 3 on the buffer space 8 may have a depth of about 12000 Å in the prior art. The residual dielectric material on buffer space 8 may be a path of stress when a wafer is sawed. Thereby, the reliability of the dies may be reduced.

SUMMARY OF THE INVENTION

An objective of the present invention is to provide a new method of fabricating a die seal capable of removing the dielectric layer on the buffer space of die seal and preventing the residual dielectric layer from becoming a path of stress when a wafer is sawed.

Another objective of the present invention is to provide a method for fabricating a die seal without application of additional mask.

In order to achieve these objectives, the present invention provides a method for fabricating a die seal. The structure of the die seal formed on a silicon substrate can be used to prevent lateral stress, which may damage the internal circuit in a die. The die seal comprises a buffer space, a die seal and a buffer area. The buffer area is adjacent to the internal circuit. The buffer space is adjacent to a scribe line. The seal ring, which is a stacked structure comprising at least one metal layer and at least one dielectric layer, is located between the buffer area and the buffer space. Finally, a passivation layer is formed and covers the entire die seal. Before the step of forming the passivation layer, an amorphous silicon film is formed on the top metal layer. The amorphous silicon film has a thickness of between 100 Å and 1500 Å. At the step of etching the passivation layer, the amorphous silicon film serves as an etch stop layer to protect the metal layer under the amorphous silicon film, especially the metal bonding layer in the bonding pad. The dielectric layer on the buffer space is removed via the step of etching the passivation layer. In this way, the die seal can be protected from stress damage. The amorphous silicon film is formed between the top metal layer and an anti-reflection layer. Generally speaking, an anti-reflection layer is used to prevent a reflection error at the step of defining a metal layer pattern. When the dielectric layer on the buffer space is made of $SiO_2$, a plasma containing $CF_2$ and $H_2$ can be applied in the step of etching the passivation layer. The $SiO_2$ layer on the buffer space can be removed completely because the plasma process has an extremely high etching selectivity ratio between the $SiO_2$ and Si.

DESCRIPTION OF THE DRAWINGS

Other objectives, features, and advantages of the present invention will become apparent from the following detailed description made with reference but non-limiting embodiment. The description is made with reference to the accompanying drawings, in which.

DESCRIPTION OF THE PREFERRED EMBODIMENT

Figure 4:
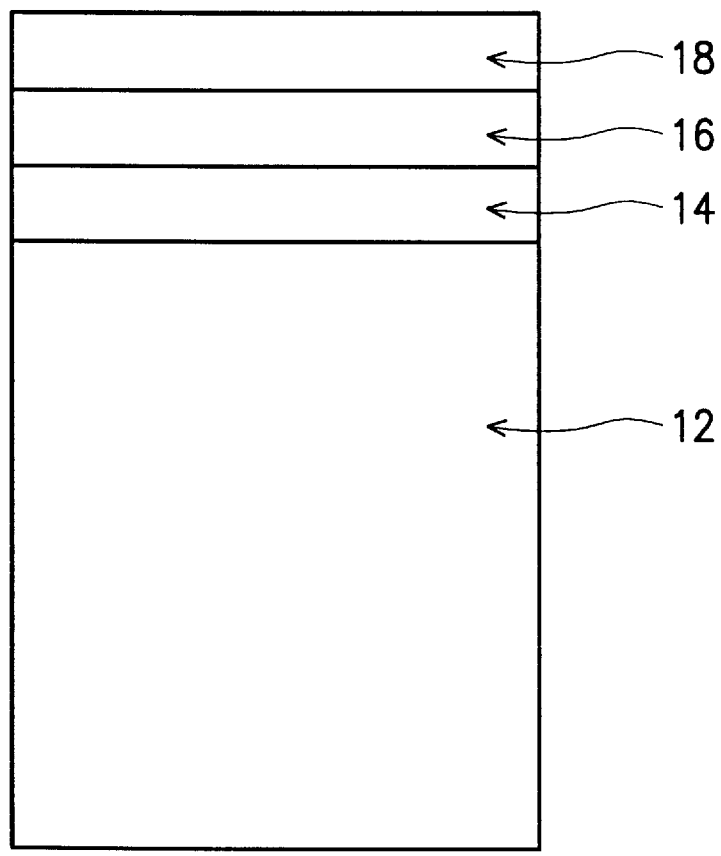
FIG. 4 is a cross-sectional view showing the top metal layer, the amorphous layer and the anti-reflection layer of the multi-layer interconnection according to the present invention.

Now referring to FIG. 4, after the formation of a top metal layer 12, an amorphous silicon film 14 is formed on the surface of the top metal layer 12 via plasma-enhanced chemical-vapor deposition (PECVD), physical-vapor deposition (PVD), or the like. There are two effects in the application of the amorphous silicon film after the amorphous silicon film is patterned. The first effect is to serve as an etch stop layer to remove the dielectric layer on the buffer space when a passivation layer is etched. The second effect is to enhance the anti-reflection after a metal layer is subsequently patterned. Then, an anti-reflection (ARC) layer 16 is formed on the amorphous silicon film 14. The use of an ARC to improve the imaging of the photoresist used when subsequently patterning the metal layer is discussed in "Silicon Processing for the VLSI Era", Volume 1, published by Lattice Press, 1986, at page 441. Most common materials of an anti-reflection layer are TiN and TiW when the metal is aluminum. The main objective of the present invention is achieved by forming the amorphous silicon film 14 between the top metal layer 12 and anti-reflection layer 16.

Figure 1:
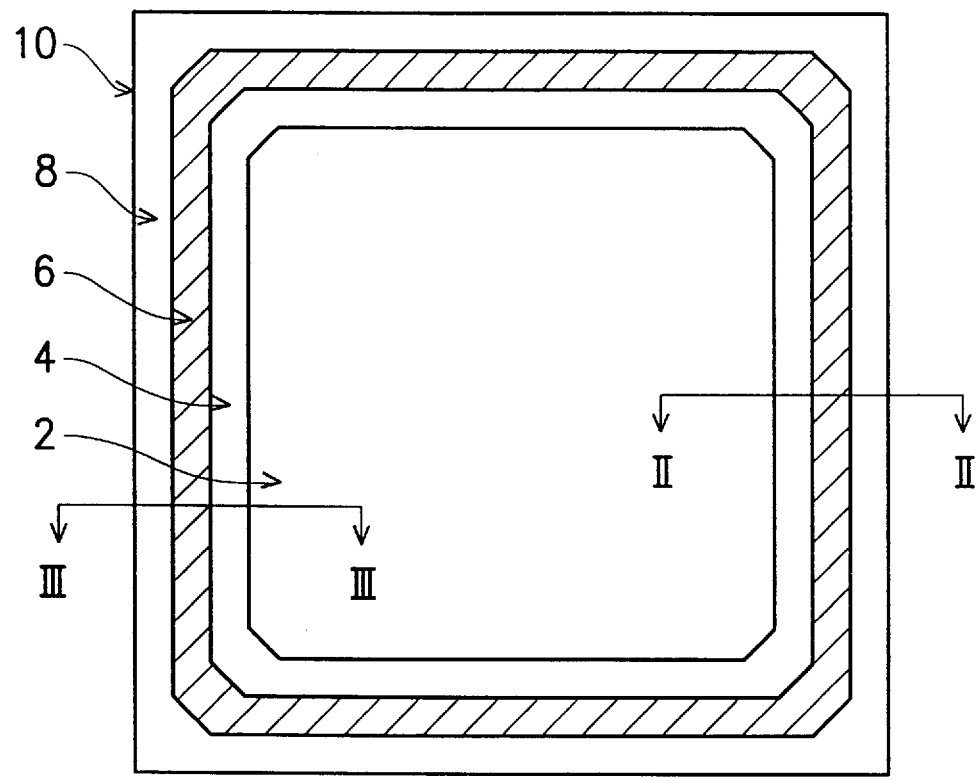
FIG. 1 is a top view of a single die after sawing a wafer.
Figure 2:
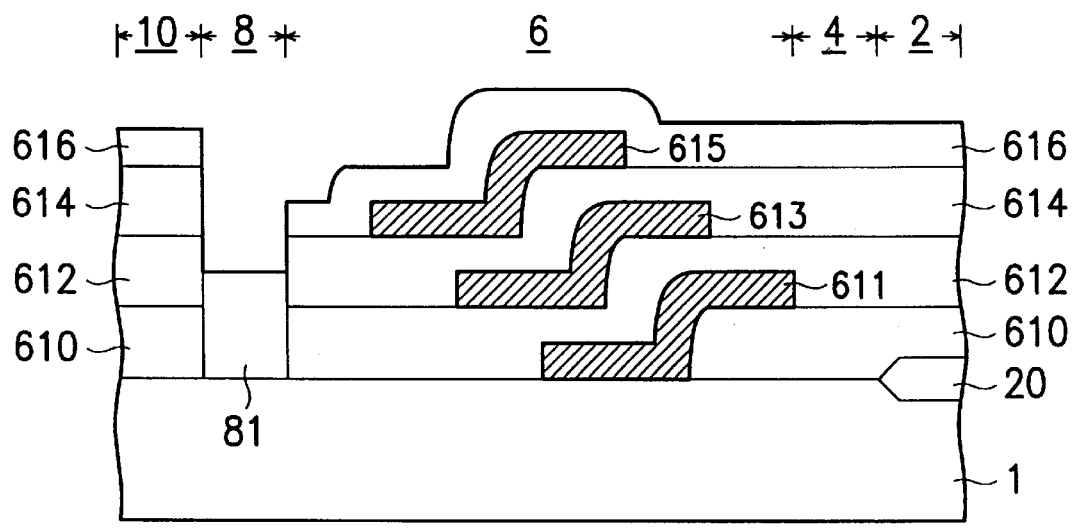
FIG. 2 (PRIOR ART) is a cross-sectional view of one conventional structure of a die seal.
Figure 3:
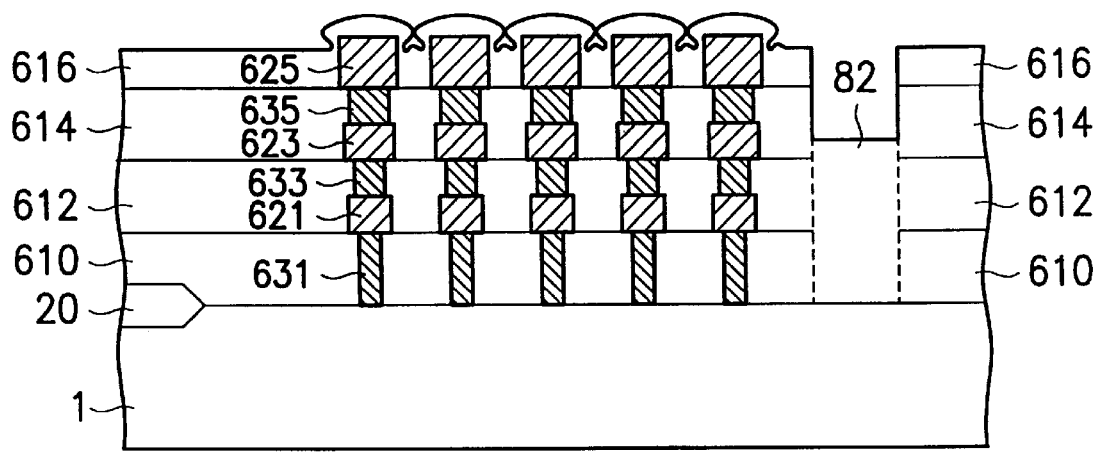
FIG. 3 (PRIOR ART) is a cross-sectional view of another conventional structure of a die seal.

After the anti-reflection layer 16 is formed, the subsequent steps are the same as that of the prior art until the step of etching a passivation layer 18 shown in FIG. 4. In the step of etching the passivation layer 18, the amorphous silicon film 14 serves as an etch stop layer. The dielectric layer on the buffer space can be removed via the subsequent etching step. The dielectric layer is, for example, the dielectric layer 81 shown in FIG. 2 or the dielectric layer 82 shown in FIG. 3. When the passivation layer 18 is etched, the amorphous silicon film 14 will serve as an etch stop layer to protect the metal layer under the amorphous silicon film from etching, especially the metal bonding layer in the bonding pad. When the dielectric layer on the buffer space is made of $SiO_2$, a plasma containing $CF_4$ and $H_2$ can be applied in the step of etching the passivation layer. The $SiO_2$ layer on the buffer space can be removed completely because the plasma process has an extremely high etching selectivity ratio between the $SiO_2$ and Si. Generally speaking, the higher ratio of $H_2$ that the plasma contains, the higher the etching selectivity ratio between $SiO_2$ and Si. When the ratio of $H_2$ in the plasma exceeds 40%, the etching selectivity ratio can be about 60 (i.e. the $SiO_2$ etched and the Si etched have a ratio of 60:1). Based on the etching method and the thickness of $SiO_2$ on the buffer space, the thickness of the amorphous silicon layer 14 is between 100 Å and 1500 Å. Similarly, the thickness of the anti-reflection layer 16 can be 400 Å or less.

In the method of fabrication a die seal of the present invention, there are three advantages to inserting an amorphous silicon film between a top metal layer and an anti-reflection layer:

1. In the step of etching the passivation layer, the amorphous silicon film serves as an etch stop layer to protect the top metal layer under the amorphous silicon film. The residual dielectric layer on the buffer space is removed via the step of etching the passivation layer. In the prior art, the residual dielectric layer on the buffer space may be a path of stress when a wafer is sawed.

According to the present invention, any stress induced will not affect the internal circuit through the residual dielectric layer. The main objective of the present invention can be achieved without the application of any additional mask. This provides a fully commercial application.

2. The amorphous silicon film is characterized by high absorption efficiency and low surface reflection efficiency. Thus, the reflection ratio of the single anti-reflection layer can be reduced (i.e., improved).

3. The material of the plasma used in the step of etching the amorphous Si layer is similar to that used in the step of dry etching the metal layer and anti-reflection layer. Thus, the process compatibility is extremely high.

Having described the invention in connection with a preferred embodiment, modification will now doubtlessly suggest itself to those skilled in this technology. The foregoing description of the preferred embodiment of the invention has been provided for the purposes of illustration and description. It is not intended to be exhaustive or to limit the invention to the precise embodiment disclosed. The disclosed embodiment wad chose and described or to best explain the principles of the invention and its practical application, thereby enabling others skilled in this technology to understand the invention, to practice various other embodiment thereof and to make various modifications suited to the particular use contemplated of the present invention. As such, it is intended that the scope of this invention shall not be limited to the disclosed, but rather it is to be defined by the following claims and their equivalents.

What is claimed is:

1. A method of fabricating a die seal, said die seal comprising a buffer area adjacent to a die, a buffer space adjacent to a scribe line, and a seal ring located between said buffer area and said buffer space, said seal ring stacked by at least one metal layer and at least one dielectric layer, and a passivation layer covering on entire said die seal, said method comprising:

forming an amorphous silicon film on said top metal layer before the step of forming said passivation layer; and removing the dielectric layer on said buffer space by applying said amorphous silicon film as an etch stop layer in the step of etching said passivation layer to enhance the robustness of said die seal from damage by the scribing stress.

2. The method of claim 1, wherein said dielectric layer on said buffer space is made of $SiO_2$.

3. The method of claim 2, wherein said step of etching said passivation layer utilizes a plasma containing $CF_2$ and $H_2$.

4. The method of claim 3, wherein the thickness of said amorphous silicon film is between 100 Å and 1500 Å.

5. The method of claim 1, wherein said amorphous silicon film formed between the top layer of said metal layer and an anti-reflection layer reduces a photolighograghy error in the step of defining a pattern of said metal layer.

6. The method of claim 5, wherein said anti-reflection layer is made of TiN.

7. The method of claim 5, wherein said anti-reflection layer is made of TiW.

8. The method of claim 5, wherein the dielectric layer of said buffer space is made of $SiO_2$.

9. The method of claim 8, wherein the step of etching said passivation layer is achieved by utilizing a plasma containing $CF_4$ and $H_2$.

10. The method of claim 9, wherein the thickness of said amorphous silicon film is between 100 Å and 1500 Å.

* * * * *